United States Patent
Wang et al.

(10) Patent No.: US 7,573,124 B2
(45) Date of Patent: Aug. 11, 2009

(54) SEMICONDUCTOR PACKAGING STRUCTURE HAVING ELECTROMAGNETIC SHIELDING FUNCTION AND METHOD FOR MANUFACTURING THE SAME

(75) Inventors: Meng-Jen Wang, Ping-Tung Hsien (TW); Kuo-Pin Yang, Kao-Hsiung Hsien (TW); Wei-Min Hsiao, Kao-Hsiung (TW); Sheng-Yang Peng, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 15 days.

(21) Appl. No.: 11/772,243

(22) Filed: Jul. 2, 2007

(65) Prior Publication Data
US 2008/0087987 A1    Apr. 17, 2008

(30) Foreign Application Priority Data
Oct. 12, 2006   (TW) ................... 95137587 A

(51) Int. Cl.
*H01L 23/552* (2006.01)
(52) U.S. Cl. ............... 257/659; 257/E23.114

(58) Field of Classification Search .......... 257/659, 257/E23.114
See application file for complete search history.

(56) References Cited

U.S. PATENT DOCUMENTS

| | | | | |
|---|---|---|---|---|
| 6,060,774 A | * | 5/2000 | Terui | 257/692 |
| 7,245,011 B2 | * | 7/2007 | Liu | 257/724 |
| 2006/0102992 A1 | * | 5/2006 | Kwon et al. | 257/685 |
| 2006/0113640 A1 | * | 6/2006 | Yu et al. | 257/635 |

* cited by examiner

*Primary Examiner*—Evan Pert
*Assistant Examiner*—William Harriston
(74) *Attorney, Agent, or Firm*—Winston Hsu

(57) ABSTRACT

A semiconductor packaging structure having electromagnetic shielding function is disclosed, in which the packaging structure includes a carrier and a semiconductor substrate disposed thereon. The semiconductor substrate has a patterned passivation layer and a patterned metal layer disposed thereon, in which the patterned metal layer is electrically connected to at least a grounding pad of the carrier via a wire, whereby possessing the semiconductor packaging structure to have electromagnetic shielding function. A method for manufacturing a semiconductor packaging structure having electromagnetic shielding function is also disclosed in the present invention.

11 Claims, 6 Drawing Sheets

SEMICONDUCTOR PACKAGING STRUCTURE HAVING ELECTROMAGNETIC SHIELDING FUNCTION AND METHOD FOR MANUFACTURING THE SAME

BACKGROUND OF THE INVENTION

1. Field of the Invention

The invention relates to a semiconductor packaging structure, and more particular, to a semiconductor packaging structure having electromagnetic shielding function.

2. Description of the Prior Art

Semiconductor packaging processes typically involve electrical connections between chips and substrates via die bonding and wire bonding, external housing fabrication, and sawing processes to form a plurality of semiconductor packages.

FIG. 1 illustrates a cross-section view of a semiconductor packaging structure according to the prior art. As shown in FIG. 1, a semiconductor packaging structure 100 includes a carrier 101 and a semiconductor substrate 110 disposed on the carrier 101. A micro-electromechanical system, such as a micro-electromechanical microphone can be placed on the semiconductor substrate 110. The carrier 101 has a first surface 101a and a second surface 101b opposite to the first surface 101a, in which a plurality of pads 102 and a grounding pad 103 are disposed on the first surface 101a. In one embodiment, a grounding layer 104 can be formed in the interior of the carrier 101 for electrically connecting the grounding pad 103.

The semiconductor substrate 110 is disposed on the surface 101a of the carrier 101, in which the semiconductor substrate 110 includes a top surface 110a having a plurality of pads 112 thereon and a bottom surface 110b opposite to the top surface 110a. A micro-electromechanical system, such as a micro-electromechanical microphone is disposed on the semiconductor substrate 110. The pads 102 formed on the carrier 101 are electrically connected to the pads 112 disposed on the semiconductor substrate 110 through the wires 150. A housing 130 is provided to surround the semiconductor substrate 110. The housing 130 is composed of conductive material, and another conductive material 132 is disposed between the bottom of the housing 130 and the grounding pad 103 of the carrier 101 to provide electromagnetic shielding ability for the semiconductor packaging structure 100 and reduce the interference of electromagnetic wave for improving the sound quality of micro-electromechanical microphone.

SUMMARY OF THE INVENTION

It is an objective of the present invention to provide a semiconductor packaging structure having electromagnetic shielding function. The semiconductor packaging structure preferably includes a carrier and a semiconductor substrate disposed on the carrier. A patterned passivation layer and a patterned metal layer are formed on the semiconductor substrate, in which the patterned metal layer is electrically connected to at least a grounding pad on the substrate via a wire, thus providing an electromagnetic shielding function for the package.

It is another objective of the present invention to provide a method for fabricating a semiconductor packaging structure having electromagnetic shielding function. The method involves forming a patterned passivation layer and a patterned metal layer on a semiconductor substrate and utilizing a wire to electrically connect the patterned metal layer and a grounding pad on the substrate, thus providing the electromagnetic shielding function for the package.

A semiconductor packaging structure having electromagnetic shielding function is also provided according to the aforementioned fabrication processes. The semiconductor packaging structure has a carrier, a semiconductor substrate disposed on the carrier, a patterned passivation layer disposed on the semiconductor substrate, a patterned metal layer disposed on the patterned passivation layer, and a wire. At least a grounding pad is disposed on the carrier, and the wire is electrically connected to the patterned metal layer and the grounding pad of the carrier. The carrier has at least a first surface and a second surface opposite to the first surface, in which the first surface has a plurality of first pads and at least one grounding pad thereon. The semiconductor substrate is disposed on the first surface of the carrier. The semiconductor substrate has a top surface and a bottom surface opposite to the top surface, in which the top surface is electrically connected to the first pads of the carrier. The patterned passivation layer is disposed on the top surface of the semiconductor substrate and the patterned metal layer is disposed on the patterned passivation layer.

According to an embodiment of the present invention, the aforementioned first patterned passivation layer is formed to expose a plurality of second pads disposed on the top surface of the semiconductor substrate, and a second wire is used to electrically connect the second pads and the first pads disposed on the carrier.

According to an embodiment of the present invention, a redistributing layer and a second patterned passivation layer are formed on the aforementioned first patterned passivation layer. The redistributing layer is electrically connected to the second pads of the semiconductor substrate, and the second patterned passivation layer is formed to expose a portion of the redistribution layer, in which the exposed portion of the redistributing layer is electrically connected to the first pads of the carrier through the second wire.

It is another objective of the present invention to provide a method for fabricating semiconductor packaging structures. First, a semiconductor wafer having a top surface and a bottom surface opposite to the top surface is provided, in which the top surface has a plurality of first pads and at least a grounding pad. Next, a first patterned passivation layer is formed on the top surface of the semiconductor wafer, and a patterned metal layer is formed on the first patterned passivation layer. The semiconductor wafer is then sawed to form a plurality of semiconductor substrates, in which the top surface of every semiconductor substrate has a portion of the first pads. The semiconductor substrate is then placed on a first surface of a carrier. The carrier has a first surface and a second surface opposite to the first surface. A plurality of second pads and at least a grounding pad are disposed on the first surface of the carrier, in which the second pads are electrically connected to every portion of the first pads. A wire is then formed to electrically connect the patterned metal layer and the grounding pad.

Specifically, the semiconductor package structure of the present invention is fabricated by first forming a patterned metal layer on the patterned passivation layer and utilizing wires to electrically connect the patterned metal layer and the grounding pads of the carrier. The fabricated semiconductor package structure would then have electromagnetic shielding ability capable of reducing interference of electromagnetic waves and increase the sound quality of micro-electromechanical microphones.

These and other objectives of the present invention will no doubt become obvious to those of ordinary skill in the art after

DETAILED DESCRIPTION

It is an objective of the present invention to provide a semiconductor packaging structure having electromagnetic shielding function for reducing interference caused by electromagnetic waves and improving the sound quality of the product, such as micro-electromechanical microphones. Several embodiments are discussed below to illustrate the highlight of the present invention.

Figure 1:
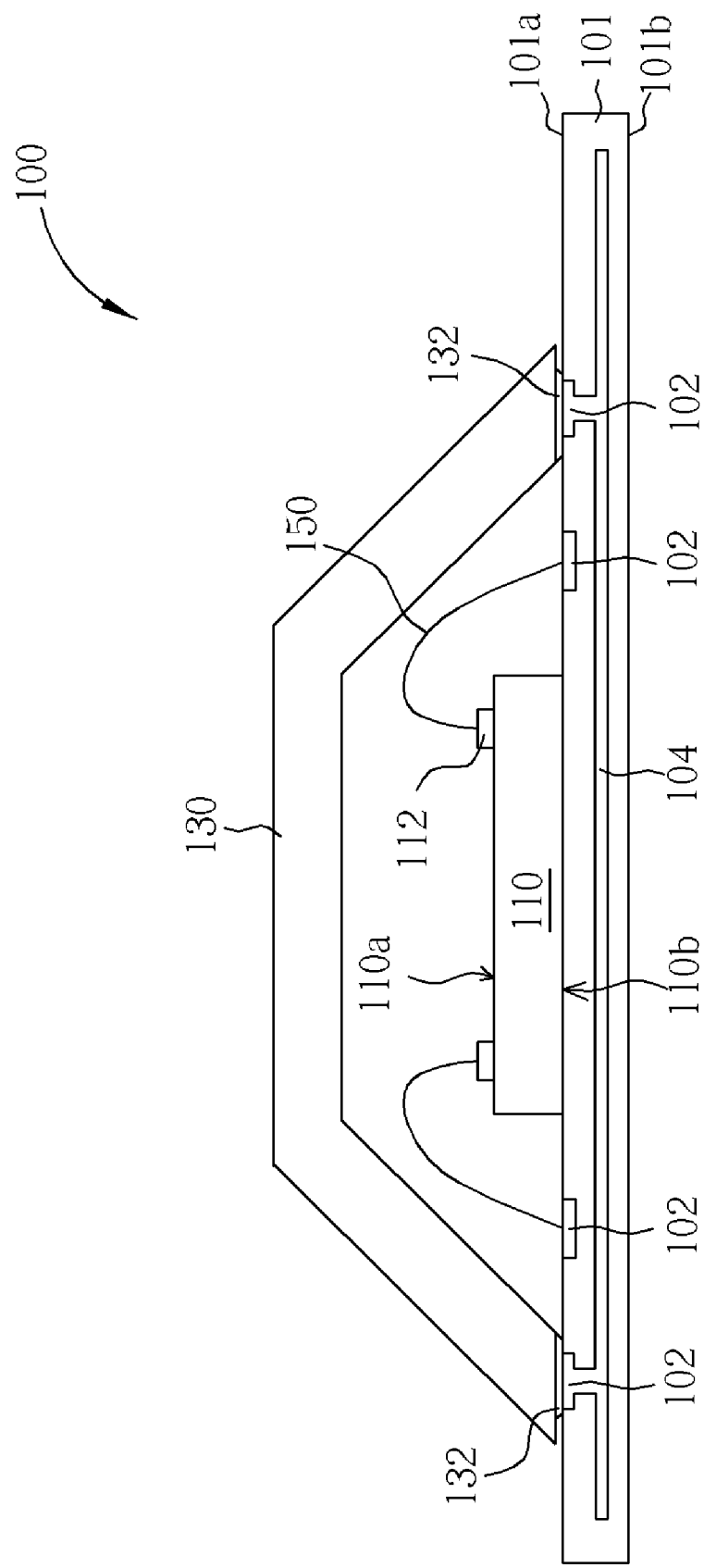
FIG. 1 illustrates a cross-section view of a semiconductor packaging structure according to the prior art.
Figure 2A:
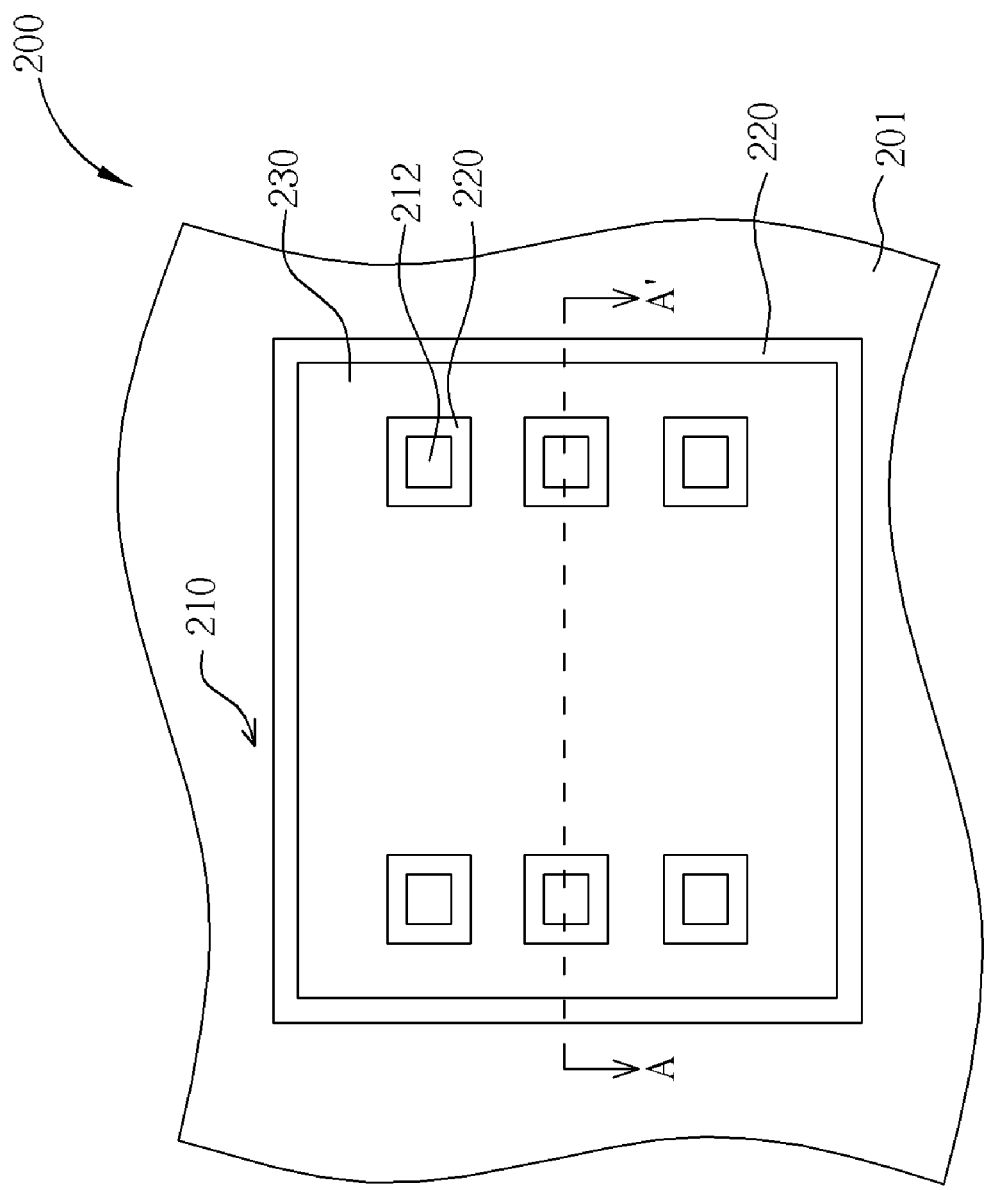
FIG. 2A illustrates a top-view of a semiconductor packaging structure according to the preferred embodiment of the present invention.

Please refer to FIG. 2A. FIG. 2A illustrates a top-view of a semiconductor packaging structure according to the preferred embodiment of the present invention. The semiconductor packaging structure 200 includes a carrier 201 and a semiconductor substrate 210 disposed on the carrier 201. A patterned passivation layer 220, a patterned metal layer 230 and a plurality of pads 212 are formed on the semiconductor substrate 210, in which the patterned metal layer 230 exposes the pads 212. A plurality of pads (not shown) and at least a grounding pad (not shown) are also disposed on the carrier. The patterned metal layer 230 is electrically connected to the grounding pad of the carrier 201, and the pads 212 of the semiconductor substrate 210 are electrically connected to the pads (not shown) of the carrier 201.

Figure 2B:
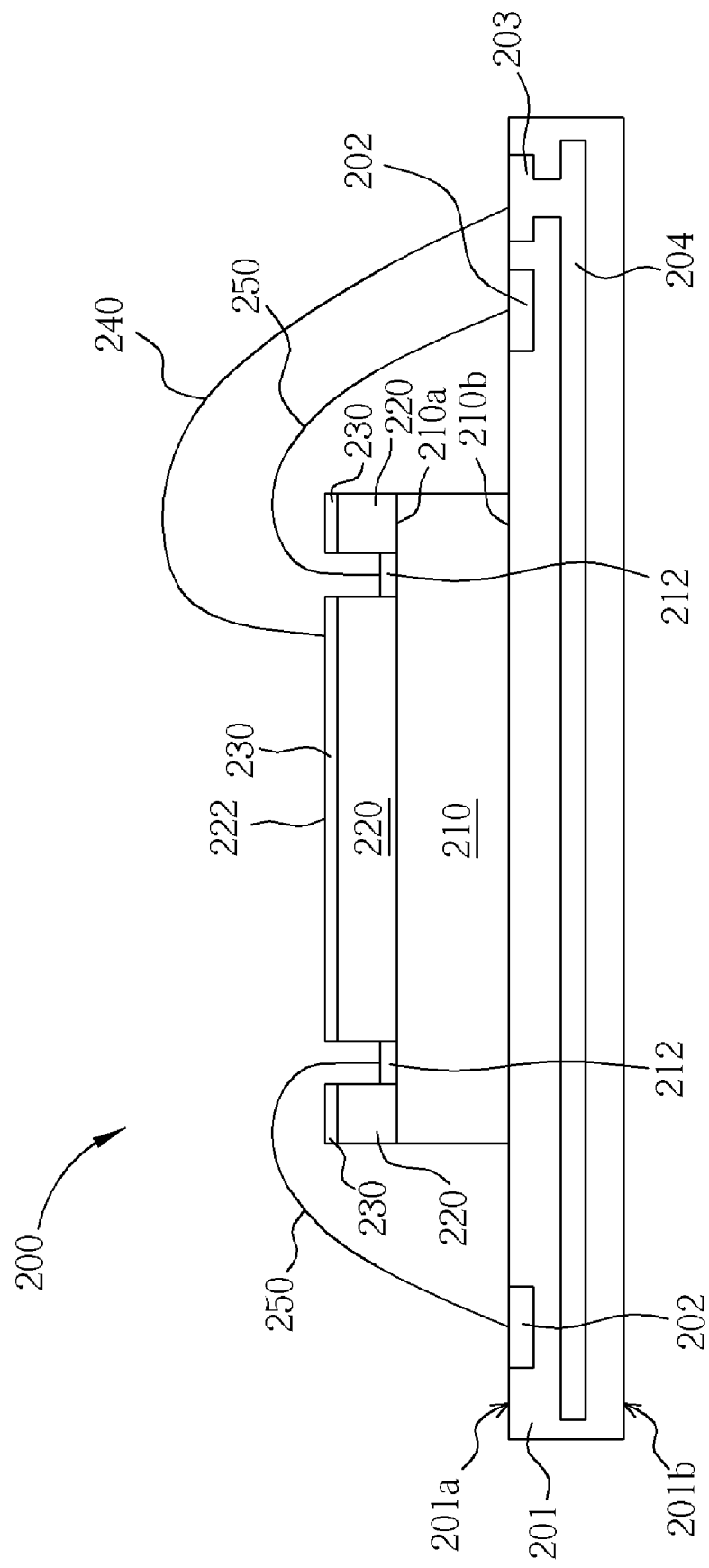
FIG. 2B illustrates a cross-section view of the semiconductor packaging structure taken along the sectional line A-A' of FIG. 2A.

Please refer to FIG. 2B. FIG. 2B illustrates a cross-section of the semiconductor packaging structure along the sectional line A-A' of FIG. 2A. Specifically, the semiconductor packaging structure 200 includes a carrier 201 and a semiconductor substrate 201 dispose on the carrier 201. A patterned passivation layer 220, a patterned metal layer 230, and a plurality of pads 212 are formed on the semiconductor substrate 210. At least a grounding pad 202 is disposed on the carrier 201. The patterned metal layer 230 is electrically connected to the ground pad 203 of the carrier through the wire 240, thus providing an electromagnetic shielding ability for the semiconductor packaging structure 200.

Preferably, a carrier 201 having a surface 201a and a surface 201b opposite to the surface 201a is first provided. A plurality of pads 202 and at least a grounding pad 203 are disposed on the surface 201a. According to an embodiment of the present invention, a grounding layer 204 is pre-formed within the carrier 201 for electrically connecting the grounding pad 203. Additionally, a grounding ring (not shown) can be formed on the surface 201a of the carrier 201 to electrically connect the grounding pad 203, which is also within the scope of the present invention. Preferably, this grounding ring is formed to surround every semiconductor substrate fabricated in the later process.

The semiconductor substrate 210 can be attached to the surface 201a of the carrier 201 by typical adhesion process. In the present invention, the semiconductor substrate 210 can be composed of integrated circuit chips or semiconductor substrates having micro-electromechanical systems such as micro-electromechanical microphones, but not limited thereto. According to an embodiment of the present invention, the semiconductor substrate 210 is formed by sawing a semiconductor wafer (not shown). The semiconductor wafer preferably has a top surface 210a and a bottom surface 210b opposite to the top surface 210a. A plurality of pads 212 is also disposed on the top surface 210a.

Subsequently, a patterned passivation layer 220 is formed on the top surface 210a of the semiconductor wafer, in which the patterned passivation layer 220 can be composed of polyimide or benzocyclobutane. According to an embodiment of the present invention, the patterned passivation layer 220 is formed to expose the pads 212 disposed on the top surface 210a of the semiconductor substrate 210, such that these pads 212 can be electrically connected to the pads 202 of the carrier 201 through the wires 250 thereafter. Next, an electroplating process or a sputtering process can be performed to form the patterned metal layer 230 on the patterned passivation layer 220, in which the patterned metal layer 230 exposes the aforementioned pads 212. The patterned metal layer 230 is composed of material having electromagnetic shielding capability, such as metals including copper or aluminum. Thereafter, the semiconductor wafer is sawed to form a plurality of semiconductor substrates 210, in which the top surface 210a of each semiconductor substrate 210 has a portion of the pads 212. Each of the semiconductor substrates 210 is then attached onto the carrier 201. The carrier 201 has a surface 201a and a surface 201b opposite to the surface 201a, in which each of the semiconductor substrates 210 is disposed on the surface 201a of the carrier 201. A plurality of pads 202 and at least a grounding pad 203 are also formed on the surface 201a of the carrier 201. The pads 202 are electrically connected to the pads 212 of each semiconductor substrate 210 through the wires 250. A wire 240 is then formed to electrically connect the patterned metal layer 230 and the grounding pad 203.

Figure 2C:
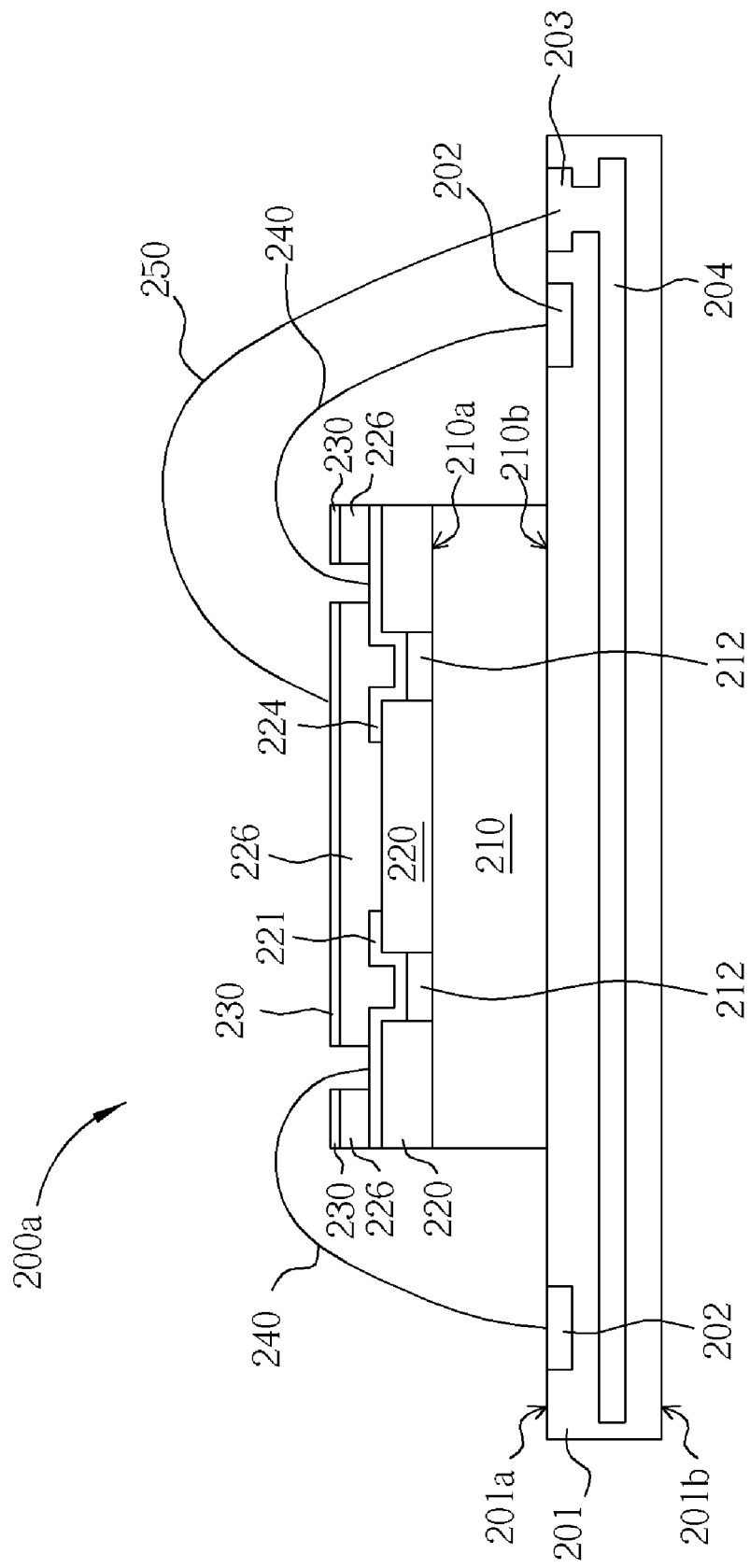
FIG. 2C illustrates a cross-section view of the semiconductor packaging structure taken along the line AA' of FIG. 2A.

Please refer to FIG. 2C. FIG. 2C illustrates a cross-section view of a semiconductor packaging structure taken along the line AA' of FIG. 2A. After the patterned passivation layer 220 is formed, a redistribution layer 224 is formed on the pads 212. The redistribution layer 224 is composed of metal, which can be used to establish an electrical connection for the pads 212 and redistribute the location of the pads 212 accordingly. Next, another patterned passivation layer 226 is formed on the patterned passivation layer 220 and the redistribution layer 224, in which the patterned passivation layer 226 exposes a portion of the redistribution layer 224. The patterned passivation layer 226 is composed of polyimide or benzocyclobutane. Thereafter, the patterned metal layer 230 is formed on the patterned passivation layer 226 to expose a portion of the redistribution layer 224, in which the formation and the material of the patterned metal layer 230 is according to the method and material described previously. The semiconductor wafer is then sawed to form a plurality of semiconductor substrates 210, in which a portion of the redistribution layer 224 is exposed from the top surface 210a of each of the semiconductor substrates 210. Next, each semiconductor substrate 210 is attached to the carrier 201. The carrier 201 has a surface 201a and a surface 201b opposite to the surface 201a, in which each semiconductor substrate 210 is disposed on the surface 201a of the carrier 201. The portion of the redistribution layer 224 exposed from the semiconductor substrate 210 is electrically connected to the pads 202 of the carrier 201 via the wires 250. A plurality of wires 240 is then formed to electrically connect the patterned metal layer 230 and the grounding pad 203.

Figure 3A:
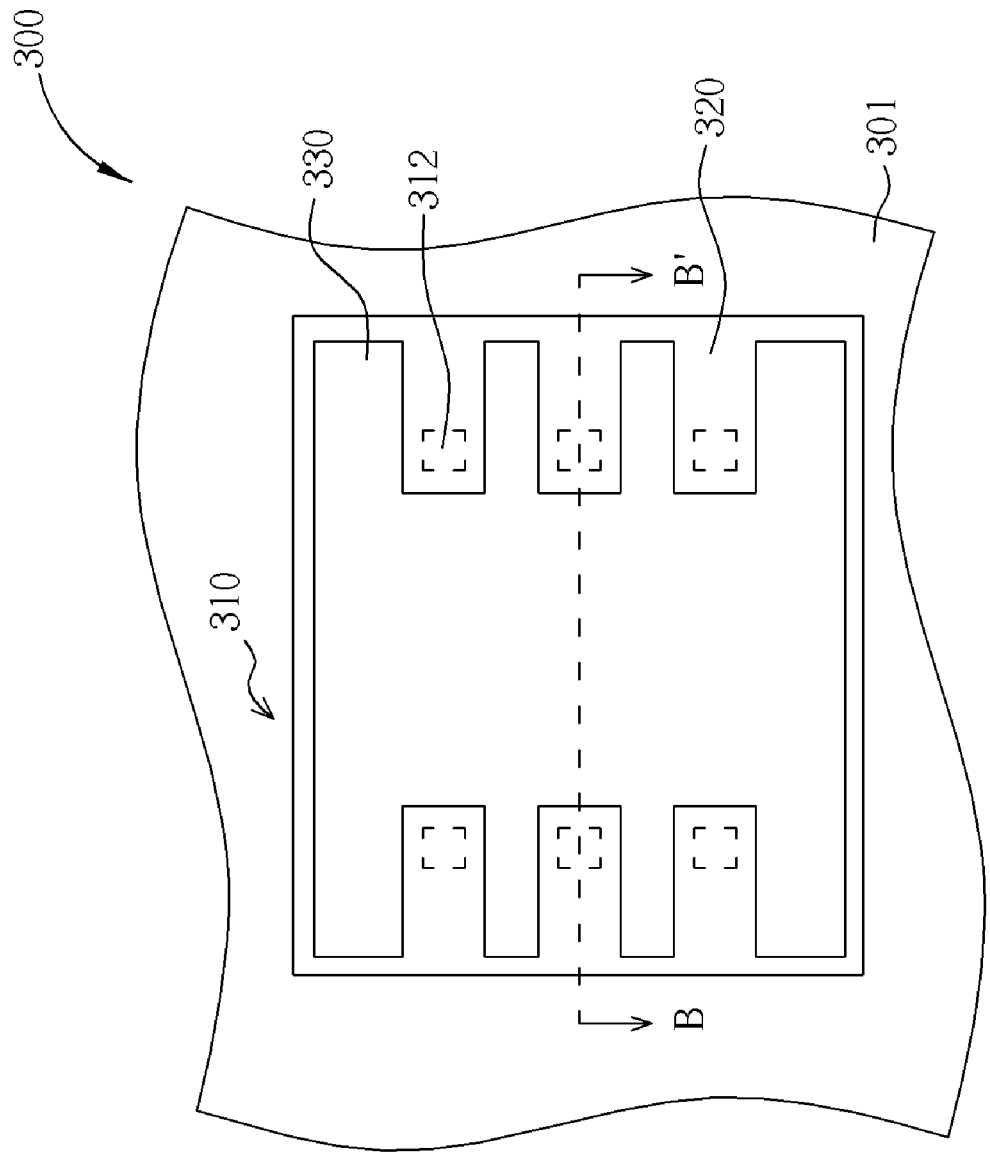
FIG. 3A illustrates a top view of a semiconductor packaging structure according to an embodiment of the present invention.

Please refer to FIG. 3A. FIG. 3A illustrates a top view of a semiconductor packaging structure according to an embodiment of the present invention. As shown in FIG. 3A, the semiconductor packaging structure 300 includes a carrier 301 and a semiconductor substrate 310 disposed on the carrier 301. A patterned passivation layer 320, a patterned metal layer 330, and a plurality of pads 212 are disposed on the semiconductor substrate 310, in which the patterned metal layer 330 is formed to expose the pads 212 and a portion of the patterned passivation layer 320. A plurality of pads (not shown) and at least a grounding pad (not shown) are disposed on the carrier 301. The patterned metal layer 330 is electrically connected to the grounding pad (not shown) of the carrier 301, and the pads 312 of the semiconductor substrate 310 are electrically connected to the pads (not shown) of the carrier 301. In contrast to FIG. 2A, the pads 312 of the semiconductor substrate 310 shown in FIG. 3A are covered by the patterned passivation layer 320, and the patterned metal layer 330 on the pads 312 are formed corresponding to the shape of a comb to expose a portion of the patterned passivation layer 320 disposed on the pads 312.

Figure 3B:
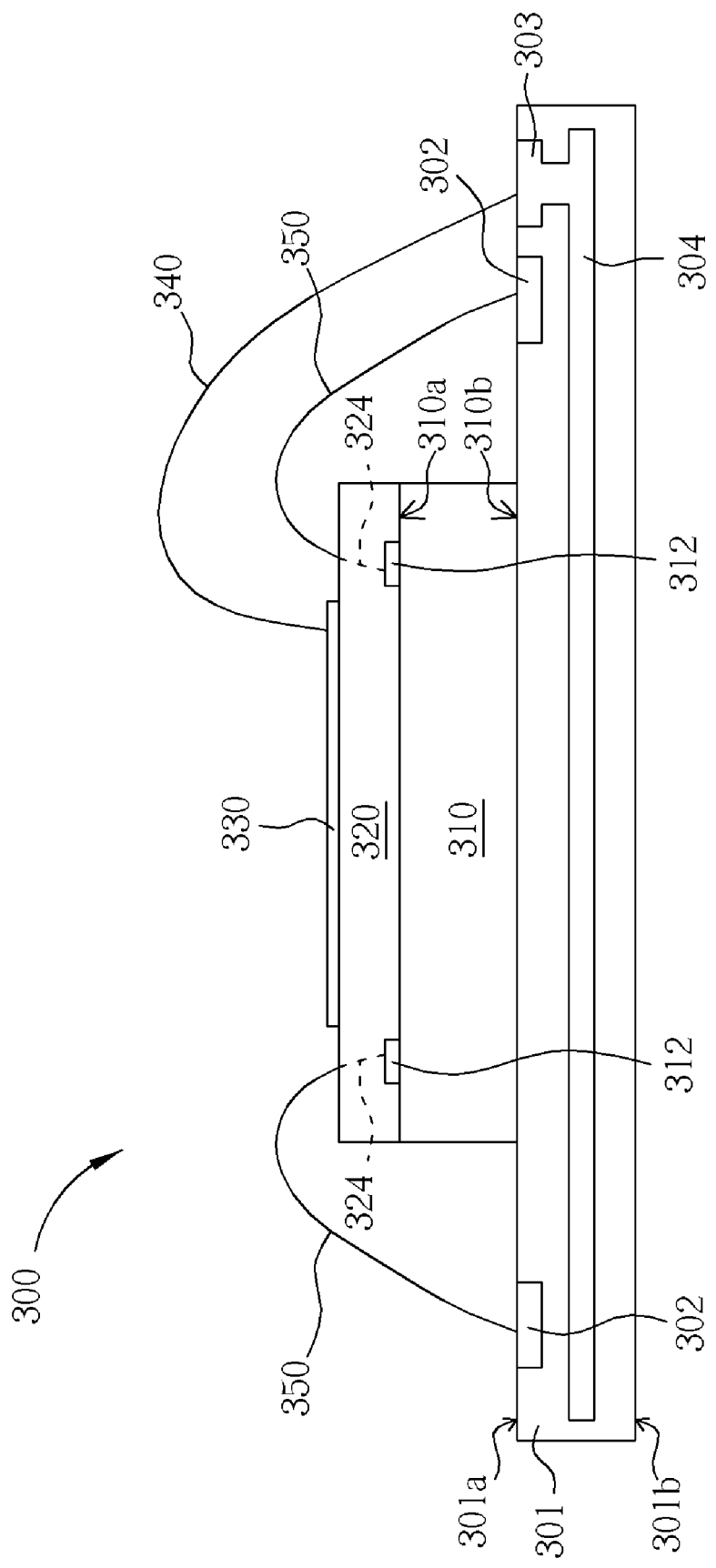
FIG. 3B illustrates a cross-section view of the semiconductor packaging structure taken along line BB' of FIG. 3A.

Please refer to FIG. 3B. FIG. 3B illustrates a cross-section view of the semiconductor packaging structure taken along line BB' of FIG. 3A. As shown in FIG. 3B, the semiconductor packaging structure 300 has a carrier 301 and a semiconductor substrate 310 disposed thereon. A patterned passivation layer 320 and a patterned metal layer 330 are formed on the semiconductor substrate 310. A grounding pad 302 is disposed on the carrier 301, and the patterned metal layer 330 formed on the semiconductor substrate 310 is electrically connected to the grounding pad 303 of the carrier 301 for providing electromagnetic shielding ability of the semiconductor packaging structure 300.

Preferably, a carrier 301 having a surface 301a and a surface 301b opposite to the surface 301a is first provided. A plurality of pads 302 and at least a grounding pad 303 are disposed on the surface 301a. According to an embodiment of the present invention, a grounding layer 304 is pre-formed within the carrier 301 for electrically connecting the grounding pad 303. Additionally, a grounding ring (not shown) can be formed on the surface 301a of the carrier 301 to electrically connect the grounding pad 303, which is also within the scope of the present invention. Specifically, this grounding ring is formed to surround every semiconductor substrate fabricated in the later processes.

The semiconductor substrate 310 can be attached to the surface 301a of the carrier 301 by typical adhesion process. In the present invention, the semiconductor substrate 310 can be composed of integrated circuit chips or semiconductor substrates having micro-electromechanical systems such as micro-electromechanical microphones, but not limited thereto. According to an embodiment of the present invention, the semiconductor substrate 310 is formed by sawing a semiconductor wafer (not shown). The semiconductor wafer preferably has a top surface 310a and a bottom surface 310b opposite to the top surface 310a. A plurality of pads 312 is also disposed on the top surface 310a of the wafer.

Thereafter, a patterned passivation layer 320 is formed on the top surface 310a of the semiconductor wafer, in which the patterned passivation layer 320 can be composed of polyimide or benzocyclobutane. According to an embodiment of the present invention, the patterned passivation layer 320 is disposed on the pads 312, in which the pads 312 are electrically connected to the pads 302 of the carrier 301 through the wires 350 thereafter. Next, an electroplating process or a sputtering process is performed to form the patterned metal layer 330 on the patterned passivation layer 320, in which the patterned metal layer 330 disposed on the pads 312 is formed corresponding to the shape of a comb for exposing a portion of the patterned passivation layer 320. Preferably, the patterned metal layer 330 is composed of metals having electromagnetic shielding ability, such as copper or aluminum. Thereafter, the semiconductor wafer is sawed to form a plurality of semiconductor substrates 310, in which the top surface 310a of each semiconductor substrate 310 has a portion of the pads 312 covered by the patterned passivation layer 320. Each of the semiconductor substrates 310 is then attached to the carrier 301. The carrier 310 has a surface 301a and a surface 301b opposite to the surface 301a, in which each of the semiconductor substrates 310 is disposed on the surface 301a of the carrier 301. A plurality of pads 302 and at least a grounding pad 303 are disposed on the surface 301a of the carrier 301. The pads 302 are electrically connected to the pads 312 of each semiconductor substrate 310 through the redistribution layer 324 and the wires 350. The wires 340 are then formed to electrically connect the patterned metal layer 330 and the grounding pad 303.

Depending on the design of the product, a housing can be fabricated on the semiconductor packaging structure of the present invention thereafter. In contrast to the conventional semiconductor packaging structures of using conductive housings to electrically connect the grounding pad of the carrier thereby providing electromagnetic shielding ability, the present invention specifically forms a patterned metal layer on the semiconductor substrate and utilizes wires to electrically connect this patterned metal layer to at least a grounding pad disposed on the carrier for providing electromagnetic shielding ability for the package. Hence, the housing of the present invention is not limited to the conductive housing utilized in the conventional art. Housings composed of other non-conductive material can also be applied in the present invention.

According to the aforementioned embodiments, the semiconductor package structure and fabrication method thereof have several advantages. Specifically, the semiconductor package structure of the present invention is fabricated by first forming a patterned metal layer on the patterned passivation layer and utilizing wires to electrically connect the patterned metal layer and the grounding pads of the carrier. The fabricated semiconductor package structure would then have electromagnetic shielding ability capable of reducing interference of electromagnetic waves and increase the sound quality of micro-electromechanical microphones.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor packaging structure having electromagnetic shielding function, comprising:
a carrier having a first surface and a second surface opposite to the first surface, wherein the first surface comprises a plurality of first pads and at least one grounding pad;
a semiconductor substrate disposed on the first surface of the carrier, wherein the semiconductor substrate comprises a top surface and a bottom surface opposite to the top surface, wherein the semiconductor substrate is electrically connected to the first pads of the carrier;

a first patterned passivation layer disposed on the top surface of the semiconductor substrate, wherein the first patterned passivation layer exposes a plurality of second pads disposed on the top surface of the semiconductor substrate, and the second pads are electrically connected to the first pads of the carrier via a plurality of second wires;

a patterned metal layer disposed on the first patterned passivation layer; and a first wire electrically connecting the patterned metal layer and the grounding pad of the carrier.

2. The semiconductor packaging structure having electromagnetic shielding function of claim 1, wherein the interior of the carrier comprises a grounding layer electrically connected to the grounding pad.

3. The semiconductor packaging structure having electromagnetic shielding function of claim 1 further comprising a grounding ring disposed on the first surface of the carrier and surrounding the semiconductor substrate for electrically connecting the grounding pad.

4. The semiconductor packaging structure having electromagnetic shielding function of claim 1, wherein the semiconductor substrate comprises a micro-electromechanical system.

5. The semiconductor packaging structure having electromagnetic shielding function of claim 4, wherein the micro-electromechanical system comprises a micro-electromechanical microphone.

6. The semiconductor packaging structure having electromagnetic shielding function of claim 1, wherein the semiconductor substrate comprises an integrated circuit chip.

7. The semiconductor packaging structure having electromagnetic shielding function of claim 1, wherein the patterned metal layer comprises copper.

8. The semiconductor packaging structure having electromagnetic shielding function of claim 1, wherein the first wire comprises gold.

9. The semiconductor packaging structure having electromagnetic shielding function of claim 1, wherein the first patterned passivation layer further comprises:

a redistributing layer disposed on the first patterned passivation layer and electrically connected to the second pads; and a second patterned passivation layer disposed on the redistributing layer and exposes a portion of the redistributing layer, wherein the exposed portion of the redistributing layer is electrically connected to the first pads of the carrier via the second wires.

10. The semiconductor packaging structure having electromagnetic shielding function of claim 1, wherein the first patterned passivation layer comprises polyimide or benzocyclobutane.

11. The semiconductor packaging structure having electromagnetic shielding function of claim 9, wherein the second patterned passivation layer comprises polyimide or benzocyclobutane.

* * * * *